United States Patent
Kinoshita et al.

(10) Patent No.: US 8,268,200 B2
(45) Date of Patent: Sep. 18, 2012

(54) PIGMENT DISPERSING COMPOSITION FOR COLOR FILTER

(75) Inventors: Hiroshi Kinoshita, Chiba (JP); Seiji Funakura, Narita (JP); Eiichi Kiuchi, Katori (JP); Yoshinori Katayama, Okegawa (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 12/734,567

(22) PCT Filed: Mar. 23, 2009

(86) PCT No.: PCT/JP2009/055584
§ 371 (c)(1),
(2), (4) Date: May 10, 2010

(87) PCT Pub. No.: WO2009/119473
PCT Pub. Date: Oct. 1, 2009

(65) Prior Publication Data
US 2010/0308284 A1    Dec. 9, 2010

(30) Foreign Application Priority Data

Mar. 28, 2008 (JP) .................. 2008-086288

(51) Int. Cl.
*G02B 5/23* (2006.01)
*G02F 1/1335* (2006.01)

(52) U.S. Cl. ........ 252/586; 252/587; 349/106; 349/187; 430/137.17; 430/137.22; 430/114; 524/849; 525/529; 525/530

(58) Field of Classification Search .................. 252/586, 252/587, 589; 423/160, 161; 524/849; 525/530, 525/529; 430/137.17, 137.22, 114; 349/106, 349/187
See application file for complete search history.

(56) References Cited

U.S. PATENT DOCUMENTS

| 7,199,177 B2 * | 4/2007 | Auschra et al. ............... 524/505 |
| 2008/0281036 A1 | 11/2008 | Ito et al. |

FOREIGN PATENT DOCUMENTS

| JP | 61-040370 A | | 2/1986 |
| JP | 2000-351916 A | | 12/2000 |
| JP | 2003-064293 A | | 3/2003 |
| JP | 2006-022164 A | | 1/2006 |
| JP | 2006-111752 A | | 4/2006 |
| JP | 2008-088211 | * | 4/2008 |
| JP | 2008-088211 A | | 4/2008 |
| JP | 2008-111019 A | | 5/2008 |
| JP | 2008-239869 A | | 10/2008 |

OTHER PUBLICATIONS

International Search Report dated Jul. 7, 2009, issued on PCT/JP2009/055584.

* cited by examiner

*Primary Examiner* — Bijan Ahvazi
(74) *Attorney, Agent, or Firm* — Edwards Wildman Palmer LLP; James E. Armstrong, IV; Junko Harada

(57) ABSTRACT

Provided is a pigment dispersing composition for a color filter including a color material, a resin, and an organic solvent which may dissolve the resin, wherein a modified pigment (D) is contained as the color material which includes, on the surface of a pigment (A), a polymer (P) obtained by polymerizing a polymer (B) containing a polymerizable unsaturated group soluble in a non-aqueous solvent and at least one type of polymerizable unsaturated monomer (C) which is soluble in the non-aqueous solvent and becomes either insoluble or poorly soluble following polymerization, alternatively wherein a modified pigment (D) is contained as the color material which is obtained, under the presence of a pigment (A), a non-aqueous solvent, and a polymer (B) containing a polymerizable unsaturated group soluble in the non-aqueous solvent, by polymerizing at least one type of polymerizable unsaturated monomer (C).

4 Claims, No Drawings

PIGMENT DISPERSING COMPOSITION FOR COLOR FILTER

TECHNICAL FIELD

The present invention relates to a pigment dispersing composition for a color filter in which a pigment is used as a color material.

BACKGROUND ART

In common color filters, a mesh-like light shielding, thin film layer called a black matrix is provided on a substrate, and colored, cured coating film layers which correspond to each colors were formed in each mesh in the black matrix and these meshes of each colors are regularly arranged therein, so that the three primary colors of light, that is, red, green and blue are selectively transmitted when the color filter is a transmission type, and the three primary colors of cyan, magenta and yellow are selectively reflected when the color filter is a reflection type. Note that each of the "mesh" of the abovementioned black matrix is commonly referred to as a "pixel".

Color filters have been used in color displays such as a color solid state imaging device, a color liquid crystal display, a color cathode ray tube (CRT) and the like. In recent years, as the color liquid crystal display panel has increased in size and has been used in a wide variety of applications, improvements in reliability have also been demanded for the color filters used therein in terms of color reproducibility, heat resistance, light resistance, chemical resistance or the like.

With respect to the method for producing a color filter, a staining method in which a dye is used as a colorant was popular initially. However, in order to meet the above demands, a pigment dispersion method using a pigment which is excellent in terms of heat resistance, light resistance, chemical resistance or the like has become popular in recent years. Among the pigment dispersion methods, a "photolithography method" has been widely used, a pigment-dispersed resist formed by adding a pigment dispersing composition in which a pigment is dispersed using a dispersant, a photopolymerizable monomer, and photopolymerization initiator to a binder, is coated onto a substrate and then dried, followed by an exposure process through a photomask, a development process and a thermal curing treatment, thereby forming a cured coating film layer of the pigment-dispersed resist in the pixel portion.

As a method for producing a color filter using the "photolithography method", for example, a method has been proposed to produce a pigment dispersing composition for a color filter, which is excellent in terms of transparency, developability and light resistance as well as storage stability, by containing a pigment, a coupling agent, an acrylic copolymer having an N,N-disubstituted amino group and acidic group in the main chain or side chain thereof, and a solvent (for example, refer to Patent Document 1). However, even with the above method, the produced color filters do not necessarily satisfy the high requirements made in recent years in terms of the properties, such as the dispersion stability, long-term storage stability and transparency.

On the other hand, a method has been known in which a pigment dispersion for a color filter which is excellent in terms of dispersion stability, long-term storage stability, transparency or the like is obtained by kneading a general purpose pigment, a resin and an organic solvent using a planetary mixer while setting the solid content ratio between the pigment and the resin (based on mass) to a specified ratio and also removing the organic solvent through evaporation (for example, refer to Patent Document 2). However, since the above method involves a constant monitoring of the solid content ratio during the kneading process, and also requires a kneading for many hours because the process is a stiffening process, it is not a simple kneading method.

[Patent Document 1]: Japanese Unexamined Patent Application, First Publication No. 2003-64293 (paragraphs [0002] through [0008])

[Patent Document 2]: Japanese Unexamined Patent Application, First Publication No. 2006-111752

DISCLOSURE OF INVENTION

Problems to be Solved by the Invention

An object of the present invention is to provide a pigment dispersing composition for a color filter which is excellent in terms of dispersion stability and storage stability using a general purpose pigment.

Means for Solving the Problems

The present inventors has discovered that the pigment invented previously (refer to Japanese Patent Application No. 2006-267283) exhibits an excellent level of dispersion stability when prepared as a pigment dispersing composition for a color filter, thereby completing the present invention; the pigment characterized by having, on the pigment surface, a polymer obtained by polymerizing a polymer containing a polymerizable unsaturated group soluble in a non-aqueous solvent and at least one type of polymerizable unsaturated monomer which is soluble in the non-aqueous solvent and becomes either insoluble or poorly soluble following polymerization.

That is, the present invention provides a pigment dispersing composition for a color filter which is a pigment dispersing composition for a color filter including a color material, a resin, and an organic solvent which may dissolve the resin, wherein a modified pigment (D) is contained as the color material which includes, on the surface of a pigment (A), a polymer (P) obtained by polymerizing a polymer (B) containing a polymerizable unsaturated group soluble in a non-aqueous solvent and at least one type of polymerizable unsaturated monomer (C) which is soluble in the non-aqueous solvent and becomes either insoluble or poorly soluble following polymerization.

In addition, the present invention provides a pigment dispersing composition for a color filter which is a pigment dispersing composition for a color filter including a color material, a resin, and an organic solvent which may dissolve the resin, wherein the pigment dispersing composition for a color filter contains a modified pigment (D) as the color material which is obtained by polymerizing at least one type of polymerizable unsaturated monomer (C) which is soluble in the non-aqueous solvent and becomes either insoluble or poorly soluble following polymerization under the presence of a pigment (A), a non-aqueous solvent, and a polymer (B) containing a polymerizable unsaturated group soluble in the non-aqueous solvent.

Effect of the Invention

According to the present invention, a pigment dispersing composition for a color filter which exhibits an excellent level of dispersion stability can be provided by using a general purpose pigment.

BEST MODE FOR CARRYING OUT THE INVENTION

Modified Pigment (D)

The modified pigment (D) used as a colorant in the present invention can be obtained by a so-called in-situ polymerization process where, under the presence of a general purpose pigment (A), a non-aqueous solvent, and a polymer (B) containing a polymerizable unsaturated group soluble in the non-aqueous solvent, at least one type of polymerizable unsaturated monomer (C) which is soluble in the non-aqueous solvent and becomes either insoluble or poorly soluble following polymerization is polymerized.

In the past, it has been thought that a polymerization site is required in the in-situ polymerization process where a pigment is finely dispersed by a dispersion stabilizer. However, in the present invention, it is thought that the interface formed between the pigment (A) and the polymer (B) containing a polymerizable unsaturated group soluble in a non-aqueous solvent due to the wetting of the surface of the pigment (A) with the polymer (B), may function as the polymerization site, and thus the presence of a site where a pigment is finely dispersed by a dispersion stabilizer is not essential. Therefore, the surface treatment of the pigment or the like for preparing the state where the pigment is finely and stably dispersed is not necessarily required, and the present invention can be applied to a wide range of different types of pigments.

(Pigment (A))

The pigment (A) used in the present invention is at least one type of pigment selected from among known, commonly used organic pigments or inorganic pigments. In addition, either an untreated pigment or a treated pigment can be used in the present invention.

Examples of the pigment (A) include known, commonly used pigments such as those described in color index handbook "New Pigment Handbook" (edited by the Pigment Technology Society of Japan, 1977), "New Pigment Application Technology" (CMC Publishing Co., Ltd., 1986) and "Printing Ink Technology" (CMC Publishing Co., Ltd., 1984).

More specific examples in terms of the pigments used in a color filter for general purpose include red pigments such as C. I. Pigment Red 254 and 177 and C. I. Pigment Orange 71; green pigments such as C. I. Pigment Green 36, 58 and 7; blue pigments such as C. I. Pigment Blue 15:6 and 22; violet pigments such as C. I. Pigment Violet 23 and 50; yellow pigments such as C. I. Pigment Yellow 138, 150 and 20; and black pigments such as C. I. Pigment Black 7, carbon black and titanium black. Although these pigments can be used alone, two or more types thereof can be mixed for use if necessary.

In general, the transparency level of the cured coating film prepared from the pigment dispersion for a color filter increases as the particle size of the contained pigments reduces, and the primary particle size thereof is preferably within a range from 10 to 80 nm, and particularly preferably within a range from 30 to 50 nm. When the primary particle size is less than 10 nm, the degree of cohesiveness of the pigments increases, which makes it difficult to satisfactorily disperse the pigments. On the other hand, when the primary particle size is greater than 80 nm, the transparency level reduces.

(Non-Aqueous Solvent)

The non-aqueous solvent used in the present invention is an organic solvent which essentially contains an aliphatic and/or alicyclic hydrocarbon-based solvent. Examples of the aliphatic and/or alicyclic hydrocarbon-based solvents include n-hexane, n-heptane, n-octane, "LAWS" and "Mineral Spirit EC" manufactured by Shell Chemicals Co., "Isopar C", "Isopar E", "Isopar G", "Isopar H", "Isopar L", "Isopar M", "Naphtha No. 3", "Naphtha No. 5" and "Naphtha No. 6" manufactured by ExxonMobil Chemical Company, "Solvent No. 7", "IP Solvent 1016", "IP Solvent 1620", "IP Solvent 2028" and "IP Solvent 2835" manufactured by Idemitsu Petrochemical Co., Ltd., "Whitesol" manufactured by Japan Energy Corporation, and "Marukasol 8" manufactured by Maruzen Petrochemical Co., Ltd.

In addition, other organic solvents may also be mixed with the non-aqueous solution, and be used within a range that does not impair the effects of the present invention. Specific examples of such organic solvents include aromatic hydrocarbon-based solvents such as "Suwasol 100" or "Suwasol 150" manufactured by Maruzen Petrochemical Co., Ltd., toluene or xylene; esters such as methyl acetate, ethyl acetate, n-butyl acetate or amyl acetate; ketones such as acetone, methyl ethyl ketone, methyl isobutyl ketone, methyl amyl ketone or cyclohexanone; and alcohols such as methanol, ethanol, n-propanol, i-propanol or n-butanol.

When using by mixing, the amount of the aliphatic and/or alicyclic hydrocarbon-based solvent used is preferably 50% by mass or more and more preferably 60% by mass or more.

(Polymer (B) Containing Polymerizable Unsaturated Group Soluble in Non-Aqueous Solvent)

Specific examples of the polymer (B) which contains a polymerizable unsaturated group soluble in a non-aqueous solvent and is used in the present invention, include a polymer in which a polymerizable unsaturated group has been introduced into a copolymer of a polymerizable unsaturated monomer having as a main component thereof an alkyl(meth)acrylate that includes an alkyl group of 4 or more carbon atoms; or a macromonomer composed of a copolymer of a polymerizable unsaturated monomer having as a main component thereof an alkyl(meth)acrylate that includes an alkyl group of 4 or more carbon atoms.

Examples of the alkyl(meth)acrylates having an alkyl group of 4 or more carbon atoms include n-butyl(meth)acrylate, i-butyl(meth)acrylate, t-butyl(meth)acrylate, 2-ethylhexyl(meth)acrylate, lauryl(meth)acrylate, stearyl(meth)acrylate, isostearyl(meth)acrylate and cyclohexyl(meth)acrylate.

In addition, examples of usable polymerizable unsaturated monomers other than the alkyl(meth)acrylates include aromatic vinyl monomers such as styrene, α-methylstyrene, p-t-butylstyrene or vinyl toluene; (meth)acrylates such as benzyl (meth)acrylate, dimethylamino(meth)acrylate, diethylamino(meth)acrylate, dibromopropyl(meth)acrylate or tribromophenyl(meth)acrylate; diesters of monovalent alcohols and unsaturated dicarboxylic acids such as maleic acid, fumaric acid or itaconic acid; and vinyl esters such as vinyl benzoate or "Veoba" (vinyl ester manufactured by Royal Dutch Shell Plc.). These monomers can be used by copolymerizing with the aforementioned alkyl(meth)acrylates.

A homopolymer of the usable polymerizable unsaturated group-containing monomer other than the alkyl(meth)acrylates has low solubility in the non-aqueous solvent. Accordingly, such a monomer is preferably used as a random polymer with an alkyl(meth)acrylate. In the case of carrying out a block or graft copolymerization using these monomers, the solubility in the non-aqueous solvent decreases considerably, thereby making it not very desirable.

These polymerizable unsaturated monomers may be used alone or a plurality of types thereof may be used in combination. Of these, the use of linear or branched alkyl(meth) acrylates having an alkyl group of 4 to 12 carbon atoms, such as n-butyl(meth)acrylate, 2-ethylhexyl(meth)acrylate or lauryl methacrylate is particularly preferable.

A copolymer of a polymerizable unsaturated monomer having as a main component thereof an alkyl(meth)acrylate that includes an alkyl group of 4 or more carbon atoms is obtained by polymerizing the polymerizable unsaturated monomer in accordance with an ordinary method.

The polymer (B) containing a polymerizable unsaturated group is obtained by introducing a polymerizable unsaturated group into the copolymer of a polymerizable unsaturated monomer having as a main component thereof an alkyl(meth) acrylate that includes an alkyl group of 4 or more carbon atoms.

Examples of the methods for introducing a polymerizable unsaturated group include:

a method in which a carboxyl group-containing polymerizable monomer such as acrylic acid or methacrylic acid, and an amino group-containing polymerizable monomer such as dimethylaminoethyl methacrylate or dimethylaminopropyl acrylamide are mixed and copolymerized in advance as copolymer components to obtain the copolymer having a carboxyl group and amino group, and then the carboxyl group and the amino group of the copolymer are reacted with a monomer having a glycidyl group and a polymerizable unsaturated group such as glycidyl methacrylate;

a method in which hydroxyl group-containing monomers such as 2-hydroxyethyl methacrylate or 2-hydroxyethyl acrylate are mixed and copolymerized in advance as copolymer components to obtain the copolymer having a hydroxyl group, and then the hydroxyl group of the copolymer is reacted with a monomer having an isocyanate group and a polymerizable unsaturated group such as isocyanate ethyl methacrylate;

a method in which a carboxyl group is introduced to a copolymer terminal end using thioglycolic acid as a chain transfer agent during polymerization, and then a monomer having a glycidyl group and a polymerizable unsaturated group such as glycidyl methacrylate is reacted with the introduced carboxyl group of the copolymer; and a method in which a carboxyl group is introduced into a copolymer using a carboxyl group-containing azo initiator such as azobis cyanopentanoic acid as a polymerization initiator, and then a monomer having a glycidyl group and a polymerizable unsaturated group such as glycidyl methacrylate is reacted with the introduced carboxyl group of the copolymer. Of these methods, in particular, a method in which a carboxyl group-containing monomer such as acrylic acid or methacrylic acid, or an amino group-containing monomer such as dimethylaminoethyl methacrylate or dimethylaminopropyl acrylamide, is copolymerized followed by reacting the carboxyl group or the amino group of the copolymer with a monomer having a glycidyl group and a polymerizable unsaturated group such as glycidyl methacrylate is the simplest, and is thus most preferable.

(Polymerizable Unsaturated Monomer (C) Soluble in Non-Aqueous Solvent and Either Insoluble or Poorly Soluble Following Polymerization)

Specific examples of the polymerizable unsaturated monomer (C) used in the present invention which is soluble in the non-aqueous solvent and becomes either insoluble or poorly soluble after polymerization include: vinyl monomers which do not have a so-called reactive polar group (functional group), such as methyl(meth)acrylate, ethyl(meth)acrylate, n-propyl(meth)acrylate or i-propyl methacrylate, or olefins such as (meth)acrylonitrile, vinyl acetate, vinyl chloride, vinylidene chloride, vinyl fluoride or vinylidene fluoride; amide bond-containing vinyl monomers such as (meth)acrylamide, dimethyl(meth)acrylamide, N-t-butyl(meth)acrylamide, N-octyl(meth)acrylamide, diacetone acrylamide, dimethylaminopropyl acrylamide or alkoxylated N-methylolated (meth)acrylamides; dialkyl[(meth)acryloyloxyalkyl]phosphates, (meth)acryloyloxyalkyl acid phosphates, dialkyl [(meth)acryloyloxyalkyl]phosphites or (meth)acryloyloxyalkyl acid phosphites; phosphorus atom-containing vinyl monomers such as 3-chloro-2-acid phosphoxypropyl(meth) acrylate, alkylene oxide addition products of the aforementioned (meth)acryloyloxy alkyl acid phosphates or acid phosphites, and ester compounds of epoxy group-containing vinyl monomers such as glycidyl(meth)acrylate or methylglycidyl (meth)acrylate and phosphoric acid, phosphorous acid or acidic esters thereof; hydroxyl group-containing polymerizable unsaturated monomers such as hydroxyalkyl esters of polymerizable unsaturated carboxylic acids or their addition products with ε-caprolactone such as 2-hydroxyethyl(meth) acrylate, 2-hydroxypropyl(meth)acrylate, 3-hydroxypropyl (meth)acrylate, 2-hydroxybutyl(meth)acrylate, 3-hydroxybutyl(meth)acrylate, 4-hydroxybutyl(meth)acrylate, 3-chloro-2-hydroxypropyl(meth)acrylate, di-2-hydroxyethylfumarate or mono-2-hydroxyethyl monobutyl fumarate, or polypropylene glycol or polyethylene glycol mono(meth) acrylate, or "PLACCEL FM or FA Monomer" (caprolactone addition monomer manufactured by Daicel Chemical Industries, Ltd.), unsaturated mono- and/or dicarboxylic acids such as (meth)acrylic acid, crotonic acid, maleic acid, fumaric acid, itaconic acid or citraconic acid, polymerizable unsaturated carboxylic acids such as monoesters of these dicarboxylic acids and monovalent alcohols, addition products of various types of unsaturated carboxylic acids in the manner of addition products of the aforementioned polymerizable unsaturated carboxylic acid hydroxy alkyl esters and anhydrides of polycarboxylic acids such as maleic acid, succinic acid, phthalic acid, hexahydrophthalic acid, tetrahydrophthalic acid, benzene tricarboxylic acid, benzene tetracarboxylic acid, "HIMIC Acid", tetrachlorophthalic acid or dodecenyl succinic acid, with monoglycidyl esters or butylglycidyl ethers of monovalent carboxylic acids such as "Cardura E", coconut oil fatty acid glycidyl ester or octylic acid glycidyl ester, or monoepoxy compounds such as ethylene oxide or propylene oxide, or their addition products with ε-caprolactone or hydroxy vinyl ether; dialkylaminoalkyl (meth)acrylates such as dimethylaminoethyl(meth)acrylate or diethylaminoethyl(meth)acrylate; epoxy group-containing polymerizable unsaturated monomers such as epoxy group-containing polymerizable compounds obtained by addition reactions at an equimolar ratio of various polyepoxy compounds having at least two epoxy groups in one molecule thereof, such as "EPICLON 200", "EPICLON 400", "EPICLON 441", "EPICLON 850" or "EPICLON 1050" (epoxy resins manufactured by DIC Corporation), or "Epicoat 828", "Epicoat 1001" or "Epicoat 1004" (epoxy resins manufactured by Japan Epoxy Resins Co., Ltd.), "Araldite 6071" or "Araldite 6084" (epoxy resins manufactured by Ciba-Geigy, Switzerland) or additionally "Chissonox 221" (an epoxy compound manufactured by Chisso Corporation) or "Denacol EX-611" (an epoxy compound manufactured by Nagase Chemicals, Ltd.), with various types of unsaturated carboxylic acids such as equimolar addition products of the aforementioned polycarboxylic acid anhydrides and hydroxyl group-containing vinyl monomers such as glycidyl meth (acrylate), (β-methyl)glycidyl(meth)acrylate, (meth)allyl glycidyl ether or polymerizable unsaturated carboxylic acids or mono-2-(meth)acryloyloxy monoethyl phthalate; isocyanate group-containing α,β-ethylenic unsaturated monomers such as 2-hydroxyethyl(meth)acrylate-hexamethylene diisocyanate equimolar addition products or monomers having an isocyanate group and vinyl group such as isocyanate ethyl (meth)acrylate; alkoxysilyl group-containing polymerizable unsaturated monomers like silicon-based monomers such as vinyl ethoxysilane, α-methacryloxypropyl trimethoxysilane, trimethylsiloxyethyl(meth)acrylate or "KR-215, X-22-5002" (products manufactured by Shin-Etsu Chemical Co., Ltd.); and, carboxyl group-containing α,β-ethylenic unsaturated monomers such as addition products of α,β-ethylenic unsaturated carboxylic acids such as monoesters of dicarboxylic acids and monovalent alcohols, unsaturated mono- or dicarboxylic acids such as (meth)acrylic acid, crotonic acid, maleic acid, fumaric acid, itaconic acid or citraconic acid, or addition products of α,β-unsaturated carboxylic acid hydroxyalkyl esters such as 2-hydroxyethyl(meth)acrylate, 2-hydroxypropyl(meth)acrylate, 3-hydroxypropyl(meth) acrylate, 2-hydroxybutyl(meth)acrylate, 3-hydroxybutyl (meth)acrylate, 4-hydroxybutyl(meth)acrylate, 3-chloro-2-hydroxypropyl(meth)acrylate, di-2-hydroxyethyl fumarate, mono-2-hydroxyethyl-monobutyl fumarate or polyethylene glycol mono(meth)acrylate, and anhydrides of polycarboxylic acids such as maleic acid, succinic acid, phthalic acid, hexahydrophthalic acid, tetrahydrophthalic acid, benzene tricarboxylic acid, benzene tetracarboxylic acid, "hymic acid", tetrachlorophthalic acid or dodecenyl succinic acid.

Of these, in particular, the use of alkyl(meth)acrylates having 3 or less carbon atoms, such as methyl(meth)acrylate or ethyl(meth)acrylate is preferable. Moreover, copolymerization using a polymerizable unsaturated monomer containing at least one type of functional group such as a carboxyl group, a sulfonate group, a phosphate group, a hydroxyl group or a dimethylamino group is preferable in order to change the surface properties of the pigment surface and to enhance interaction with a pigment dispersant or pigment-dispersing resin.

In addition, it is even more preferable that a polymer in the pigment (A) be cross-linked so that the polymer does not elute from the pigment (A) when using a modified pigment (D). Examples of the polyfunctional polymerizable unsaturated monomers used as cross-linking components include divinyl benzene, ethylene glycol di(meth)acrylate, diethylene glycol di(meth)acrylate, triethylene glycol di(meth)acrylate, polyethylene glycol di(meth)acrylate, 1,3-butanediol di(meth) acrylate, 1,4-butanediol di(meth)acrylate, 1,6-hexanediol di(meth)acrylate, neopentyl glycol dimethacrylate, trimethylolpropane triethoxy tri(meth)acrylate, trimethylolpropane tri (meth)acrylate, pentaerythritol tri(meth)acrylate, pentaerythritol tetra(meth)acrylate, dipentaerythritol hexa(meth) acrylate and allyl methacrylate.

In addition, with respect to a polymer containing at least one type of polymerizable unsaturated monomer (C) which is soluble in a non-aqueous solvent and becomes either insoluble or poorly soluble following polymerization as an essential component, other polymerizable unsaturated monomers may be used within a range so that the polymer does not dissolve in the non-aqueous solvent. Examples of the other polymerizable unsaturated monomers include the aforementioned alkyl(meth)acrylates having an alkyl group of 4 or more carbon atoms and other polymerizable unsaturated monomers which can be used apart from the aforementioned alkyl(meth)acrylates.

The modified pigment (D) used in the present invention can be obtained by polymerizing, under the presence of the general purpose pigment (A), a non-aqueous solvent, and the polymer (B) containing a polymerizable unsaturated group soluble in the non-aqueous solvent, at least one type of polymerizable unsaturated monomer (C) which is soluble in the non-aqueous solvent and becomes either insoluble or poorly soluble following polymerization.

It is preferable to mix the pigment (A) with the polymer (B) containing a polymerizable unsaturated group soluble in a non-aqueous solvent prior to carrying out a polymerization process. Examples of the mixing methods that can be used include the use of a homogenizer, a disperser, a bead mill, a paint shaker, a kneader, a roll mill, a ball mill, an attritor or a sand mill. In the present invention, the form of the pigment used is not particularly limited and may be of any form, such as a slurry, a wet cake or a powder. In other words, in the production method of the present invention, a pigment containing water in the form of a wet cake can also be used as a pigment.

The modified pigment (D) can be obtained by mixing the pigment (A) with the polymer (B), followed by further mixing the polymerizable unsaturated monomer (C) and a polymerization initiator to be described later, and carrying out a polymerization process.

During the process, although the amount of the polymer (B) used is appropriately optimized depending on the purpose and there are no particular limitations thereon, the amount used is usually within a range from 1 to 200 parts, preferably from 5 to 50 parts and more preferably from 5 to 30 parts relative to 100 parts of the pigment (A).

In addition, although the amount of the polymerizable unsaturated monomer (C) used is also appropriately optimized depending on the purpose and there are no particular limitations thereon, the amount used is usually within a range from 1 to 200 parts, preferably from 5 to 50 parts and more preferably from 5 to 30 parts relative to 100 parts of the pigment (A).

The amount of the aforementioned polymer (P) ultimately coated onto the pigment is preferably within a range from 2 to 400 parts, more preferably from 10 to 100 parts and even more preferably from 10 to 60 parts relative to 100 parts of the pigment (A). At that time, at least one type of the polymerizable unsaturated monomer (C) is usually used at a ratio of 10 to 400 parts, preferably 30 to 400 parts and more preferably 50 to 200 parts relative to 100 parts of the polymer (B).

Although the method for polymerizing the polymerizable unsaturated monomer (C) in the presence of the pigment (A), a non-aqueous solvent, and the polymer (B), may be carried out according to a known, commonly used polymerization method, it is normally carried out in the presence of a polymerization initiator. Examples of such polymerization initiators include a radical-generating polymerization catalyst such as azobis(isobutyronitrile) (AIBN), 2,2-azobis(2-methylbutyronitrile), benzoyl peroxide, t-butyl perbenzoate, t-butyl-2-ethylhexanoate, t-butyl hydroperoxide, di-t-butyl peroxide or cumene hydroperoxide, which may be used either alone or in combination of two or more types thereof.

Since some of the polymerization initiators are difficult to dissolve in the non-aqueous solvent system, a method is preferably used in which a polymerization initiator is dissolved in the polymerizable unsaturated monomer (C) and then added to a mixture of the pigment (A) and the polymer (B).

In addition, although the polymerizable unsaturated monomer (C) or the polymerizable unsaturated monomer (C) in which a polymerization initiator has been dissolved can be added by dropping in a state that the mixture has reached the polymerization temperature, a method in which it is added to the mixture at normal temperature prior to heating and then they are heated and polymerized after having been adequately mixed results in greater stability and is therefore preferable.

The polymerization temperature is normally within a range from 60 to 130° C. In addition, since there are cases in which the pigment (A) may undergo a change in state such as deterioration or crystal growth if the polymerization temperature is excessively high when the pigment (A) is an organic pigment, it is preferable to carry out a polymerization process at a temperature from 70 to 100° C. in such cases.

Following polymerization, the polymer-coated pigment can be obtained in the form of a powder by removing the non-aqueous solvent and the like used in the polymerization process by filtration followed by drying and crushing. A Nutsche or filter press and the like can be used for the filtration method. In addition, drying can be carried out with a known drying apparatus such as a box dryer, a vacuum dryer, a band dryer or a spray dryer. Further, a known crushing apparatus such as a mortar, a hammer mill, a disk mill, a pin mill or a jet mill can be used for crushing.

(Pigment Dispersing Composition for Color Filter)

The pigment dispersing composition for color filter according to the present invention can be obtained by dispersing the modified pigment (D) in a resin solution in which a pigment dispersant, such as a resin, is mixed with an organic solvent. In such cases, a known and commonly used pigment dispersing method can be employed to carry out a pigment dispersion process using a disperser, such as a ball mill, a sand mill, a bead mill, a triple roll mill, a paint conditioner, an attritor, a dispersion stirrer, and an ultrasonic disperser. Specific examples of the dispersers include the "Super Apex Mill" (manufactured by Kotobuki Engineering & Manufacturing Co., Ltd.), the "Ultra Apex Mill" (manufactured by Kotobuki Engineering & Manufacturing Co., Ltd.), the Draiswerke PM-DCP stirring-type bead mill device (manufactured by Draiswerke GmbH), and the "Pico Grain Mill" (manufactured by Asada Iron Works. Co., Ltd.).

Examples of the grinding media used during the pigment dispersion include grinding media made of zirconia or steel. Of these, a grinding medium made of zirconia which exhibits an excellent level of abrasion resistance is particularly preferable. In addition, the diameter of the grinding medium is preferably within a range from 0.01 to 3.0 mm, and particularly preferably within a range from 0.05 to 0.5 mm. When the diameter of the grinding medium is greater than 3.0 mm, a wet pulverization process cannot be conducted satisfactorily, which makes it undesirable.

In terms of the pigment dispersant used during the pigment dispersion process, a known pigment dispersant commonly used in the pigment dispersion process can be used. Examples thereof include a surface active agent, a pigment intermediate or a derivative thereof, a dye intermediate or a derivative thereof, and a resin-type dispersant such as a polyamide-based resin, a polyurethane-based resin, a polyester-based resin and an acrylic resin. Among various dispersants described above, it is preferable to use a polyester-based resin and an acrylic resin.

As the commercially available products of resin-type dispersants, for example, "DISPERBYK-130", "DISPERBYK-161", "DISPERBYK-162", "DISPERBYK-163", "DISPERBYK-170", "DISPERBYK-171", "DISPERBYK-174", "DISPERBYK-180", "DISPERBYK-182", "DISPERBYK-183", "DISPERBYK-184", "DISPERBYK-185", "DISPERBYK-2000", "DISPERBYK-2001", "DISPERBYK-2020", "DISPERBYK-2050", "DISPERBYK-2070", "DISPERBYK-2096" and "DISPERBYK-2150" manufactured by BYK-Chemie GmbH, "EFKA1503", "EFKA4010", "EFKA4020", "EFKA4300", "EFKA4330", "EFKA4340", "EFKA4520", "EFKA4530", "EFKA5054", "EFKA7411", "EFKA7422", "EFKA7431", "EFKA7441", "EFKA7461", "EFKA7496" and "EFKA7497" manufactured by Ciba Specialty Chemicals Inc., "SOLSPERSE 3000", "SOLSPERSE 9000", "SOLSPERSE 13240", "SOLSPERSE 13650", "SOLSPERSE 13940", "SOLSPERSE 17000", "SOLSPERSE 18000", "SOLSPERSE 20000", "SOLSPERSE 21000", "SOLSPERSE 20000", "SOLSPERSE 24000", "SOLSPERSE 26000", "SOLSPERSE 27000", "SOLSPERSE 28000", "SOLSPERSE 32000", "SOLSPERSE 36000", "SOLSPERSE 37000", "SOLSPERSE 38000", "SOLSPERSE 41000", "SOLSPERSE 42000", "SOLSPERSE 43000", "SOLSPERSE 46000", "SOLSPERSE 54000" and "SOLSPERSE 71000" manufactured by The Lubrizol Corporation, "AJISPER PB-711", "AJISPER PB-821", "AJISPER PB-822", "AJISPER PB-814" and "AJISPER PB-824" manufactured by Ajinomoto Fine-Techno Co., Inc., and the like can be used.

In addition, it is also possible to use a leveling agent, a coupling agent, a cationic surface active agent or the like at the same time. In the present invention, these dispersants can also be used by combining two or more types thereof.

Examples of the organic solvent used during the pigment dispersion process include aromatic solvents such as toluene, xylene, and methoxybenzene; acetic acid ester based solvents such as ethyl acetate, propyl acetate, butyl acetate, propylene glycol monomethyl ether acetate, and propylene glycol monoethyl ether acetate; propionate based solvents such as ethoxyethyl propionate; alcohol based solvents such as methanol and ethanol; ether based solvents such as butyl cellosolve, propylene glycol monomethyl ether, diethylene glycol ethyl ether, and diethylene glycol dimethyl ether; ketone based solvents such as methyl ethyl ketone, methyl isobutyl ketone, and cyclohexanone; aliphatic hydrocarbon based solvents such as hexane; nitrogen compound based solvents such as N,N-dimethylformamide, γ-butyrolactam, N-methyl-2-pyrrolidone, aniline, and pyridine; lactone based solvents such as γ-butyrolactone; carbamic acid esters such as a 48:52 mixture of methyl carbamate and ethyl carbamate; and water. Of these, the polar solvents that are water-soluble such as a propionate-based solvent, an alcohol-based solvent, an ether-based solvent, a ketone-based solvent, a nitrogen compound-based solvent, and a lactone-based solvent are particularly preferable. When a water-soluble organic solvent is used, it is also possible to use water with the solvent. In the present invention, these solvents can also be used by combining two or more types thereof.

There are no particular limitations on the ratio at which each of the components is used. However, the amount of the pigment dispersant used is generally within a range from 5 to 200 parts, preferably from 10 to 100 parts and more preferably from 10 to 60 parts, relative to 100 parts of the modified pigment (D), and the organic solvent is used so that the total solid content of the modified pigment (D) and the pigment dispersant is within a range from 10 to 25%, and preferably from 10 to 20%.

(Color Filter)

The pigment dispersing composition for a color filter according to the present invention can be used for producing color filters having each color pixel portions of red, green and blue, as well as the black matrix.

When producing a color filter, any of the known and commonly used production methods such as the photolithography method, the ink jet method, and the printing method can be adopted. The photolithography method will be described below using examples.

The photolithography method is a method in which a photocurable composition, prepared by appropriately mixing a photocurable monomer or oligomer, a photopolymerization initiator, or the like with the pigment dispersing composition for a color filter according to the present invention, is first coated on the surface of a transparent substrate for a color filter, where a black matrix is provided, and then dried by heating (prebaked), followed by a pattern exposure process conducted by irradiating ultraviolet rays having a wavelength within a range from 200 to 500 nm or visible light thereon via a photomask to cure the photocurable composition coated at the place that corresponds to the pixel portion, and thereafter the unexposed portions are developed with a developing solution and then the non-pixel portions are removed so as to fix the pixel portion on the transparent substrate. In this method, the pixel portion composed of a cured and colored film that is made of the photocurable composition is formed on the transparent substrate. By preparing the photocurable composition for each black, red, green, and blue color modified pigments (D) and repeating the aforementioned operations, it is possible to produce a color filter in which the black matrix is formed and having colored pixel portions of red, green, and blue at predetermined positions.

In addition, it is also possible to use a modified pigment (D) of yellow color or a modified pigment (D) of violet color concomitantly for forming these red, green and blue pixel portions. Further, if necessary, the entire color filter may also be subjected to a heat treatment (postbaking) following the photocuring process.

Examples of the method for coating the photocurable composition on a transparent substrate such as glass include a spin coating method, a roll coating method, and an ink jet method. In addition, although the conditions for drying by heating a photocurable composition following the coating process differ depending on the types and the amount of each component, the drying by heating is usually carried out at a temperature from 50 to 150° C. for about 1 to 15 minutes.

Further, examples of the developing methods following the pattern exposure process include a puddle method, a dipping method, and a spray method. After the exposure and development of the photocurable composition, the transparent substrate where pixel portions of necessary colors are formed is washed with water and then dried.

The color filters obtained in such a manner are then subjected to a heating treatment (postbaking) for a predetermined time at a temperature from 100 to 280° C. using a heating device such as a hotplate and an oven in order to eliminate volatile components in the coating film as well as to thermally cure the unreacted photocurable compound remaining in the cured and colored coating film of the photocurable composition so as to complete the production of color filters.

Although the method for producing a color filter by the photolithography method among other pigment dispersion methods is described here in detail, the method is not limited to the photolithography method, and the color filter which is prepared by using the pigment dispersing composition for a color filter according to the present invention can also be produced by other methods such as an electrodeposition method, a transfer process, micelle electrolysis, and a photovoltaic electrodeposition (PVED) method.

EXAMPLES

The present invention will be described in detail below with reference to a series of Examples. The terms "parts" and "%" used in the following examples are based on the mass unless stated otherwise.

Reference Example 1

Synthesis of Polymer (B-1) Containing a Polymerizable Unsaturated Group Soluble in a Non-Aqueous Solvent 500 parts of heptane and 470 parts of butyl acetate were placed in a four-necked flask equipped with a thermometer, a stirrer, a reflux condenser and a nitrogen gas inlet tube followed by heating to 90° C., and then, when the temperature reached 90° C., a mixture composed of 985 parts of butyl acrylate, 15 parts of methacrylic acid and 7 parts of 2,2'-azobis(2-methylbutyronitrile) was dropwise added thereto over 5 hours, and the reaction was continued for 10 hours following completion of the dropwise addition while maintaining the same temperature. After lowering the temperature of the reaction liquid to 50° C., a solution containing 0.2 parts of t-butylpyrocatechol dissolved in 15 parts of butyl acetate was added followed by the addition of 15 parts of glycidyl methacrylate and 30 parts of dimethylaminoethanol. Then, the mixture was heated to 80° C., and the reaction was further carried out for 10 hours at the same temperature to obtain a solution of the polymer (B-1) containing a polymerizable unsaturated group soluble in a non-aqueous solvent.

Reference Example 2

Synthesis of Polymer (B-2) Containing a Polymerizable Unsaturated Group Soluble in a Non-Aqueous Solvent 500 parts of heptane and 500 parts of butyl acetate were placed in the same reaction apparatus used in Reference Example 1 followed by heating to 90° C., and then, when the temperature reached 90° C., a mixture composed of 950 parts of butyl acrylate, 50 parts of dimethylaminoethyl methacrylate and 7 parts of 2,2'-azobis(2-methylbutyronitrile) was dropwise added thereto over 5 hours, and the reaction was further continued for 10 hours following completion of the dropwise addition while maintaining the same temperature. After lowering the temperature of the reaction liquid to 50° C., a solution containing 0.2 parts of t-butylpyrocatechol dissolved in 20 parts of butyl acetate was added, followed by the addition of 20 parts of glycidyl methacrylate. Then, the mixture was heated to 80° C., and the reaction was further carried out for 10 hours at the same temperature to obtain a solution of the polymer (B-2) containing a polymerizable unsaturated group soluble in a non-aqueous solvent.

Reference Example 3

Synthesis of Modified Pigment (D-1)

200 parts of $\epsilon$ type copper phthalocyanine blue crude having an average primary particle size of 0.1 to 10 μm, 1,400 parts of ground sodium chloride, and 200 parts of diethylene glycol were charged in a twin-arm type kneader, and then kneaded at a temperature of 80° C. to 90° C. for 10 hours. After kneading, the kneaded mixture was collected in 20,000 parts of a 1% aqueous solution of hydrochloric acid of 80° C. and stirred for one hour, followed by repetition of filtration and washing with hot water, and the resultant was finally subjected to pressure filtration, thereby yielding a wet cake containing 48% of a pigment component in the form of an $\epsilon$ type copper phthalocyanine blue (C. I. Pigment Blue 15:6).

The average primary particle size measured using the transmission electron microscope JEM-2010 (manufactured by JEOL Ltd.) was 40 nm.

208 parts of the obtained wet cake of ε type copper phthalocyanine blue (pigment content: 48%), 10 parts of the polymer (B-1) obtained in Reference Example 1, 600 parts of 1.25 mm zirconia beads and 300 parts of heptane were placed in a polyethylene wide-mouthed bottle followed by mixing for 90 minutes with a paint shaker (Toyo Seiki Co., Ltd.). After diluting the resultant with 300 parts of heptane, the zirconia beads were removed to prepare a pigment mixed liquid.

After placing 400 parts of the resulting pigment mixed liquid in a separable flask equipped with a thermometer, a stirrer, a reflux condenser and a nitrogen gas inlet tube, a solution of 1 part of 2,2'-azobis(2-methylbutyronitrile) dissolved in a polymerizable monomer composition consisting of 3.2 parts of methyl methacrylate and 1.7 parts of ethylene glycol dimethacrylate serving as the polymerizable monomer (C) and 200 parts of heptane were added to the mixed liquid. After 30 minutes of continuous stirring at room temperature, the temperature of the mixture was raised to 80° C. and the reaction was continued for 15 hours at the same temperature. After cooling, filtration was carried out to separate the modified pigment and polymerization solvent. The resulting modified pigment was dried for 5 hours at 100° C. with a hot air dryer followed by grinding with a grinder to yield a modified pigment (D-1).

Reference Example 4

Synthesis of Modified Pigment (D-2)

208 parts of the wet cake of ε type copper phthalocyanine blue (pigment content: 48%) obtained in Reference Example 3, 15 parts of the polymer (B-1) obtained in Reference Example 1, 600 parts of 1.25 mm zirconia beads and 300 parts of heptane were placed in a polyethylene wide-mouthed bottle followed by mixing for 90 minutes with a paint shaker (Toyo Seiki Co., Ltd.). After diluting the resultant with 300 parts of heptane, the zirconia beads were removed to prepare a pigment mixed liquid.

After placing 400 parts of the resulting pigment mixed liquid in the same reaction apparatus used in Reference Example 3, a solution, in which 1 part of t-butylacrylamide sulfonic acid serving as the polymerizable monomer (C) had been dissolved in 20 parts of ion exchanged water, was added to the mixed liquid. Furthermore, a solution of 1 part of 2,2'-azobis(2-methylbutyronitrile) dissolved in a polymerizable monomer composition consisting of 2.2 parts of methyl methacrylate and 1.7 parts of ethylene glycol dimethacrylate and 200 parts of heptane were added to the resulting mixture. After 30 minutes of continuous stirring at room temperature, the temperature of the mixture was raised to 80° C. and the reaction was continued for 15 hours at the same temperature. After cooling, filtration was carried out to separate the modified pigment and polymerization solvent. The resulting modified pigment was dried for 5 hours at 100° C. with a hot air dryer followed by grinding with a grinder to yield a modified pigment (D-2).

Reference Example 5

Synthesis of Modified Pigment (D-3)

100 parts of Fastogen Green 2YK-CF (C. I. Pigment Green 36, a polyhalogenated copper phthalocyanine pigment manufactured by DIC Corporation), 10 parts of AB-6 (a polybutyl acrylate macromonomer manufactured by Toagosei Co., Ltd.), 600 parts of 1.25 mm zirconia beads and 300 parts of heptane were placed in a polyethylene wide-mouthed bottle followed by mixing for 60 minutes with a paint shaker (Toyo Seiki Co., Ltd.). After diluting the resultant with 400 parts of heptane, the zirconia beads were removed to prepare a pigment mixed liquid.

After placing 400 parts of the resulting pigment mixed liquid in a reaction apparatus in the same manner as in Reference Example 3, a solution, in which 0.8 parts of t-butylacrylamide sulfonic acid serving as the polymerizable monomer (C) had been dissolved in 20 parts of ion exchanged water, was added to the mixed liquid. Furthermore, a solution of 1 part of 2,2'-azobis(2-methylbutyronitrile) dissolved in a polymerizable monomer composition consisting of 2.4 parts of methyl methacrylate and 1.7 parts of ethylene glycol dimethacrylate and 140 parts of heptane were added to the resulting mixture. After 30 minutes of continuous stirring at room temperature, the temperature of the mixture was raised to 80° C. and the reaction was continued for 15 hours at the same temperature. After cooling, filtration was carried out to separate the polymer modified pigment and polymerization solvent. The resulting polymer modified pigment was dried for 5 hours at 100° C. with a hot air dryer followed by grinding with a grinder to yield a modified pigment (D-3).

Reference Example 6

Synthesis of Modified Pigment (D-4)

200 parts of a polybrominated zinc phthalocyanine having an average primary particle size of 0.1 to 10 μm, 2,000 parts of ground sodium chloride, and 200 parts of diethylene glycol were charged in a twin-arm type kneader, and then kneaded at 100° C. for 8 hours. Following completion of the kneading, the kneaded mixture was collected in a hot water of 60° C. and stirred for one hour, followed by repetition of filtration and washing with hot water, and the resultant was finally subjected to pressure filtration, thereby yielding a wet cake containing 45% of a pigment component in the form of the polybrominated zinc phthalocyanine (C. I. Pigment Green 58). The average primary particle size measured using the transmission electron microscope JEM-2010 (manufactured by JEOL Ltd.) was 50 nm.

222 parts of the obtained wet cake of polybrominated zinc phthalocyanine, 10 parts of the polymer (B-2) obtained in Reference Example 2, 600 parts of 1.25 mm zirconia beads and 300 parts of heptane were placed in a polyethylene wide-mouthed bottle followed by mixing for 60 minutes with a paint shaker (Toyo Seiki Co., Ltd.). After diluting the resultant with 300 parts of heptane, the zirconia beads were removed to prepare a pigment mixed liquid.

After placing 400 parts of the resulting pigment mixed liquid in a reaction apparatus in the same manner as in Reference Example 3, a solution, in which 1 part of t-butylacrylamide sulfonic acid serving as the polymerizable monomer (C) had been dissolved in 20 parts of ion exchanged water, was added to the mixed liquid. Furthermore, a solution of 1 part of 2,2'-azobis(2-methylbutyronitrile) dissolved in a polymerizable monomer composition consisting of 1.9 parts of methyl methacrylate and 1.9 parts of ethylene glycol dimethacrylate and 140 parts of heptane were added to the resulting mixture. After cooling, filtration was carried out to separate the polymer modified pigment and polymerization solvent. The resulting polymer modified pigment was dried for 5 hours at 100° C. with a hot air dryer followed by grinding with a grinder to yield a modified pigment (D-4).

Reference Example 7

Synthesis of Modified Pigment (D-5)

100 parts of Irgaphor RED BT-CF (a product manufactured by Ciba Specialty Chemicals Inc.), 15 parts of the polymer (B-2) obtained in Reference Example 2, 600 parts of 1.25 mm zirconia beads and 300 parts of heptane were placed in a polyethylene wide-mouthed bottle followed by mixing for 60 minutes with a paint shaker (Toyo Seiki Co., Ltd.). After diluting the resultant with 400 parts of heptane, the zirconia beads were removed to prepare a pigment mixed liquid.

After placing 400 parts of the resulting pigment mixed liquid in a reaction apparatus in the same manner as in Reference Example 3, a solution of 1.5 parts of 2,2'-azobis(2-methylbutyronitrile) dissolved in a polymerizable monomer composition consisting of 2.2 parts of styrene and 5.2 parts of divinyl benzene (a content of 55% containing 45% of structural isomer (ethyl vinyl benzene) serving as the polymerizable monomer (C) and 160 parts of heptane were added to the mixed liquid. After 30 minutes of continuous stirring at room temperature, the temperature of the mixture was raised to 80° C. and the reaction was continued for 15 hours at the same temperature. After cooling, filtration was carried out to separate the polymer modified pigment and polymerization solvent. The resulting polymer modified pigment was dried for 5 hours at 100° C. with a hot air dryer followed by grinding with a grinder to yield a modified pigment (D-5).

Reference Example 8

Synthesis of Modified Pigment (D-6)

100 parts of Hostaperm Violet RL-NF (C. I. Pigment Violet 23, a product manufactured by Clariant International Ltd.), 20 parts of the polymer (B-1) obtained in Reference Example 1, 600 parts of 1.25 mm zirconia beads and 300 parts of heptane were placed in a polyethylene wide-mouthed bottle followed by mixing for 60 minutes with a paint shaker (Toyo Seiki Co., Ltd.). After diluting the resultant with 400 parts of heptane, the zirconia beads were removed to prepare a pigment mixed liquid.

After placing 400 parts of the resulting pigment mixed liquid in a reaction apparatus in the same manner as in Reference Example 3, a solution, in which 0.8 parts of t-butylacrylamide sulfonic acid serving as the polymerizable monomer (C) had been dissolved in 20 parts of ion exchanged water, was added to the mixed liquid. Furthermore, a solution of 1.5 parts of 2,2'-azobis(2-methylbutyronitrile) dissolved in a polymerizable monomer composition consisting of 4.3 parts of methyl methacrylate and 2.2 parts of ethylene glycol dimethacrylate and 120 parts of heptane were added to the resulting mixture. After 30 minutes of continuous stirring at room temperature, the temperature of the mixture was raised to 80° C. and the reaction was continued for 15 hours at the same temperature. After cooling, filtration was carried out to separate the polymer modified pigment and polymerization solvent. The resulting polymer modified pigment was dried for 5 hours at 100° C. with a hot air dryer followed by grinding with a grinder to yield a modified pigment (D-6).

Reference Example 9

Synthesis of Modified Pigment (D-7)

100 parts of Yellow Pigment E4GN (C. I. Pigment Yellow 150, a product manufactured by Bayer AG), 15 parts of the polymer (B-2) obtained in Reference Example 2, 600 parts of 1.25 mm zirconia beads and 300 parts of heptane were placed in a polyethylene wide-mouthed bottle followed by mixing for 60 minutes with a paint shaker (Toyo Seiki Co., Ltd.). After diluting the resultant with 400 parts of heptane, the zirconia beads were removed to prepare a pigment mixed liquid.

After placing 400 parts of the resulting pigment mixed liquid in a reaction apparatus in the same manner as in Reference Example 3, a solution, in which 1 part of t-butylacrylamide sulfonic acid serving as the polymerizable monomer (C) had been dissolved in 20 parts of ion exchanged water, was added to the mixed liquid. Furthermore, a solution of 1.5 parts of 2,2'-azobis(2-methylbutyronitrile) dissolved in a polymerizable monomer composition consisting of 3.4 parts of methyl methacrylate and 2.9 parts of ethylene glycol dimethacrylate and 150 parts of heptane were added to the resulting mixture. After 30 minutes of continuous stirring at room temperature, the temperature of the mixture was raised to 80° C. and the reaction was continued for 15 hours at the same temperature. After cooling, filtration was carried out to separate the polymer modified pigment and polymerization solvent. The resulting polymer modified pigment was dried for 5 hours at 100° C. with a hot air dryer followed by grinding with a grinder to yield a modified pigment (D-7).

Example 1

9 parts of the modified pigment (D-1) obtained in Reference Example 3, 0.5 parts of copper phthalocyanine methyl monophthalimide (a derivative of phthalocyanine) and 0.5 parts of copper phthalocyanine monosulfonic acid (a derivative of phthalocyanine) serving as dispersion auxiliary agents, 5 parts of AJISPER PB-814 (a pigment dispersant manufactured by Ajinomoto Fine-Techno Co., Inc. and containing an active ingredient of 60%), 57.2 parts of propylene glycol monomethyl ether acetate were mixed, followed by the addition of 0.3 mmΦSEPR beads thereto, and the resulting mixture was dispersed for 3 hours using a paint shaker (Toyo Seiki Co., Ltd.). Then, the 0.3 mmΦSEPR beads were removed, thereby yielding a pigment dispersing composition. The viscosity of the obtained pigment dispersion measured under the conditions of 20° C. and 10 rpm using a viscometer (RE-550L, manufactured by Told Sangyo Co., Ltd.) was 10 mPa·s.

In addition, the viscosity of 10 mPa·s did not change even after 1 week of storage at 40° C., confirming that the pigment dispersing composition exhibited a high level of dispersion stability with no pigment sedimentation. In terms of the viscosity change, a viscosity change within ±10% was regarded as satisfactory.

Examples 2 to 7

Pigment dispersing compositions were prepared in the same manner as in Example 1 with the exception that the used modified pigment (D-1), derivative, solvent and pigment dispersant were changed to those described in Tables 1 and 2, and the viscosity and storage stability thereof were evaluated.

Comparative Example 1

10 parts of Fastogen Green 2YK-CF (C. I. Pigment Green 36, a polyhalogenated copper phthalocyanine pigment manufactured by DIC Corporation used for preparing the modified pigment (D-3)), 10 parts of AJISPER PB-814 (a pigment dispersant manufactured by Ajinomoto Fine-Techno Co., Inc.

and containing an active ingredient of 60%), 55.2 parts of propylene glycol monomethyl ether acetate were mixed, followed by the addition of 0.3 mmΦSEPR beads thereto, and the resulting mixture was dispersed for 3 hours using a paint shaker (Toyo Seiki Co., Ltd.). Then, the 0.3 mmΦSEPR beads were removed, thereby yielding a pigment dispersing composition. The viscosity of the obtained pigment dispersion measured under the conditions of 20° C. and 10 rpm using a viscometer (RE-550L, manufactured by Told Sangyo Co., Ltd.) was 11 mPa·s.

However, the viscosity of the obtained pigment dispersion measured after 1 week of storage at 40° C. was increased to 24 mPa·s, and the pigment sedimentation was also observed. Since the extent of viscosity change was beyond the range of ±10%, the obtained pigment dispersion was regarded as unsatisfactory.

Comparative Example 2

A pigment dispersing composition was prepared in the same manner as in Example 1 with the exception that the used pigment, solvent and pigment dispersant were changed to those described in Table 2, and the viscosity and storage stability thereof were evaluated.

In Table 2, the "pigment 1" indicates "Fastogen Green 2YK-CF (C. I. Pigment Green 36, a polyhalogenated copper phthalocyanine pigment manufactured by DIC Corporation)", "pigment 2" indicates "Hostaperm Violet RL-NF (C. I. Pigment Violet 23, a product manufactured by Clariant International Ltd.)", "AJISPER PB-814" indicates a "pigment dispersant manufactured by Ajinomoto Fine-Techno Co., Inc., containing an active ingredient of 60%", "DISPERBYK-2001" indicates a "pigment dispersant manufactured by BYK-Chemie GmbH, containing an active ingredient of 46%", and "PGMEA" indicates "propylene glycol monomethyl ether acetate".

Although Comparative Example 1 shows an example in which an unmodified form of the modified pigment (D-3) used in Example 3 was used, the extent of viscosity change was great and the pigment sedimentation was also observed. In addition, although Comparative Example 2 shows an example in which an unmodified form of the modified pigment (D-6) used in Example 6 was used, this example also resulted in the greater extent of viscosity change as well as the observation of pigment sedimentation. On the other hand, the pigment dispersing compositions for color filters according to the present invention which used the modified pigments (D-1)

TABLE 1

|  |  | Example 1 | Example 2 | Example 3 | Example 4 | Example 5 |
|---|---|---|---|---|---|---|
| Modified pigment | | (D-1) | (D-2) | (D-3) | (D-4) | (D-5) |
| Numerical values represent the number of parts | | 9 | 9.5 | 10 | 10 | 10 |
| Phthalocyanine derivative 1 | | 0.5 | 0.5 | — | — | — |
| Phthalocyanine derivative 2 | | 0.5 | — | — | — | — |
| AJISPER PB-814 | | 6.7 | 6.7 | — | — | — |
| DISPERBYK-2001 | | — | — | 13 | 13 | 13 |
| PGMEA | | 61.1 | 61.1 | 65.8 | 65.8 | 65.8 |
| Viscosity (mPa · s) | | 10 | 9 | 8 | 7 | 9 |
| Storage stability | Viscosity change | Satisfactory | Satisfactory | Satisfactory | Satisfactory | Satisfactory |
| | Pigment sedimentation | None | None | None | None | None |

In Table 1, the "phthalocyanine derivative 1" indicates "copper phthalocyanine methyl monophthalimide (dispersion auxiliary agent)", "phthalocyanine derivative 2" indicates "copper phthalocyanine monosulfonic acid (dispersion auxiliary agent)", "AJISPER PB-814" indicates a "pigment dispersant manufactured by Ajinomoto Fine-Techno Co., Inc., containing an active ingredient of 60%", "DISPERBYK-2001" indicates a "pigment dispersant manufactured by BYK-Chemie GmbH, containing an active ingredient of 46%", and "PGMEA" indicates "propylene glycol monomethyl ether acetate".

to (D-7) exhibited stable dispersibility, which was independent of the type of pigments used.

Application Example 1

Method for Producing a Color Filter 75 parts of the pigment dispersing composition obtained in Example 2, 5.5 parts of polyester acrylate resin (Aronix (trade name) M7100 manufactured by TOAGOSEI Co., Ltd.), 5 parts of dipentaerythritol hexacrylate (KAYARAD (trade

TABLE 2

|  |  | Example 6 | Example 7 | Comparative Example 1 | Comparative Example 2 |
|---|---|---|---|---|---|
| Modified pigment | | (D-6) | (D-7) | — | — |
| Numerical values represent the number of parts | | 10 | 10 | | |
| Pigment 1 | | — | — | 10 | — |
| Pigment 2 | | — | — | — | 10 |
| AJISPER PB-814 | | 10 | — | — | 10 |
| DISPERBYK-2001 | | — | 13 | 13 | — |
| PGMEA | | 68.9 | 65.8 | 65.8 | 68.8 |
| Viscosity (mPa · s) | | 10 | 11 | 11 | 18 |
| Storage stability | Viscosity change | Satisfactory | Satisfactory | Unsatisfactory | Unsatisfactory |
| | Pigment sedimentation | None | None | Observed | Observed | name) DPHA manufactured by Nippon Kayaku Co., Ltd.), 1 part of benzophenone (KAYACURE (trade name) BP-100 manufactured by Nippon Kayaku Co., Ltd.), and 13.5 parts of UCAR Ester EFP were stirred to mix using a dispersion stirrer. The resultant was then filtered using a filter having a pore size of 1.0 μm to obtain a color resist. The obtained color resist was coated on a glass plate having a thickness of 1 mm using a spin coater so that the resulting dried film will have a thickness of 1 μm. The coated color resist was then predried at 60° C. for 5 minutes to form a coating film. Then the coating film was subjected to an exposure using ultraviolet radiation, and was then cured by a heat treatment conducted at 230° C. for 15 minutes to form a color filter.

Brightness was measured by placing the color filter between two polarizing plates and setting a light source on one plate and a CCD camera on the other, and intensities of transmitted light were measured when two polarization axes were parallel to each other and when two polarization axes were perpendicular to each other, thereby calculating the contrast from the ratio of two values on brightness (intensity of transmitted light) obtained by the measurements. As a result, the contrast of the obtained color filter was 5,900.

Application Example 2

75 parts of the pigment dispersing composition obtained in Example 4, 5.5 parts of polyester acrylate resin (Aronix (trade name) M7100 manufactured by TOAGOSEI Co., Ltd.), 5 parts of dipentaerythritol hexacrylate (KAYARAD (trade name) DPHA manufactured by Nippon Kayaku Co., Ltd.), 1 part of benzophenone (KAYACURE (trade name) BP-100 manufactured by Nippon Kayaku Co., Ltd.), and 13.5 parts of UCAR Ester EFP were stirred to mix using a dispersion stirrer. The resultant was then filtered using a filter having a pore size of 1.0 μm to obtain a color resist. The obtained color resist was coated on a glass plate having a thickness of 1 mm using a spin coater so that the resulting dried film will have a thickness of 1 μm. The coated color resist was then predried at 60° C. for 5 minutes to form a coating film. Then the coating film was subjected to an exposure using ultraviolet radiation, and was then cured by a heat treatment conducted at 230° C. for 15 minutes to form a color filter.

The contrast of the obtained color filter was measured in the same manner as in Application Example 1. As a result, the contrast was 8,800.

INDUSTRIAL APPLICABILITY

In the present invention, the pigment dispersing composition for a color filter is highly stable, and the color filter produced using the pigment dispersing composition exhibits a high contrast, and thus the present invention can be used for producing a color filter having high performance.

In addition, the pigment dispersing composition for a color filter according to the present invention can also be used for other applications apart from the color filters, such as a printing ink, a coating material, a colored resin molded product, a toner for electrostatic charge development, and an ink for ink jet printing.

The invention claimed is:

1. A color filter comprising a pigment dispersing composition comprising: a color material; a resin; and an organic solvent which dissolves the resin; wherein a modified pigment (D) is contained as the color material which includes, on the surface of a pigment (A), a polymer (P) obtained by polymerizing a polymer (B) containing a polymerizable unsaturated group soluble in a non-aqueous solvent and at least one polymerizable unsaturated monomer (C) which is soluble in the non-aqueous solvent and becomes insoluble following polymerization.

2. A color filter comprising a pigment dispersing composition comprising: a color material; a resin; and an organic solvent which dissolves the resin; wherein a modified pigment (D) is contained as the color material which is obtained, in the presence of a pigment (A), a non-aqueous solvent, and a polymer (B) containing a polymerizable unsaturated group soluble in the non-aqueous solvent, by polymerizing at least one polymerizable unsaturated monomer (C) which is soluble in the non-aqueous solvent and becomes insoluble following polymerization.

3. The pigment dispersing composition for a color filter according to claim 1,
wherein the non-aqueous solvent contains an aliphatic hydrocarbon-based solvent and/or an alicyclic hydrocarbon-based solvent.

4. The pigment dispersing composition for a color filter according to claim 2,
wherein the non-aqueous solvent contains an aliphatic hydrocarbon-based solvent and/or an alicyclic hydrocarbon-based solvent.

* * * * *